United States Patent
Hayashi et al.

(10) Patent No.: US 9,508,373 B2
(45) Date of Patent: Nov. 29, 2016

(54) PERPENDICULARLY MAGNETIZED ULTRATHIN FILM EXHIBITING HIGH PERPENDICULAR MAGNETIC ANISOTROPY, METHOD FOR MANUFACTURING SAME, AND APPLICATION

(71) Applicant: National Institute for Materials Science, Ibaraki (JP)

(72) Inventors: Masamitsu Hayashi, Ibaraki (JP); Sinha Jaivardhan, Ibaraki (JP); Masaya Kodzuka, Ibaraki (JP); Tomoya Nakatani, Ibaraki (JP); Yukiko Takahashi, Ibaraki (JP); Takao Furubayashi, Ibaraki (JP); Seiji Mitani, Ibaraki (JP); Kazuhiro Hono, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 14/367,348

(22) PCT Filed: Mar. 22, 2013

(86) PCT No.: PCT/JP2013/058226
§ 371 (c)(1),
(2) Date: Jun. 20, 2014

(87) PCT Pub. No.: WO2013/141337
PCT Pub. Date: Sep. 26, 2013

(65) Prior Publication Data
US 2015/0132609 A1    May 14, 2015

(30) Foreign Application Priority Data

Mar. 22, 2012   (JP) .............................. 2012-065085

(51) Int. Cl.
*G11C 11/16*   (2006.01)
*G11B 5/66*   (2006.01)
(Continued)

(52) U.S. Cl.
CPC ........... *G11B 5/656* (2013.01); *C23C 14/0641* (2013.01); *C23C 14/34* (2013.01);
(Continued)

(58) Field of Classification Search
None
See application file for complete search history.

(56) References Cited

U.S. PATENT DOCUMENTS

| 5,236,791 A * | 8/1993 | Yahisa ..................... G11B 5/72 428/611 |
| 8,247,093 B2 * | 8/2012 | Rodmacq ............... B82Y 25/00 365/173 |

(Continued)

OTHER PUBLICATIONS

Fukami et al., Low-Current Perpendicular Domain Wall Motion Cell for Scalable High-Speed MRAM, Symposium on VLSI Tech. Digest of Tech. Papers, pp. 230-231, 2009.
(Continued)

*Primary Examiner* — Kevin Bernatz
(74) *Attorney, Agent, or Firm* — Morgan, Lewis & Bockius LLP

(57) ABSTRACT

Provided are an element structure in which a magnetic layer has a high magnetic anisotropy constant and saturated magnetization properties in a thickness of 1.5 nm or less, and a magnetic device that uses the element structure. A BCC metal nitride/CoFeB/MgO film structure that uses a nitride of a BCC metal as a seed layer is fabricated. The nitride amount in the BCC metal nitride is preferably less than 60% in terms of volume ratio based on 100% BCC metal. It is thereby possible to readily obtain a perpendicularly magnetized film having the magnetic properties that the perpendicular magnetic anisotropy is $0.1 \times 10^6$ erg/cm$^3$ or more and the saturated magnetization is 200 emu/cm$^3$ or more, even when the thickness of the magnetic layer is 0.3 nm or more and 1.5 nm or less.

6 Claims, 1 Drawing Sheet

OXIDE LAYER

MAGNETIC LAYER

SEED LAYER

(51) Int. Cl.
  G11B 5/65      (2006.01)
  G11B 5/64      (2006.01)
  G11B 5/73      (2006.01)
  G11B 5/851     (2006.01)
  H01L 43/08     (2006.01)
  H01L 43/10     (2006.01)
  H01L 43/12     (2006.01)
  H01F 10/30     (2006.01)
  H01F 10/32     (2006.01)
  C23C 14/06     (2006.01)
  C23C 14/34     (2006.01)
  G01R 33/00     (2006.01)
  G11C 11/14     (2006.01)
  G01R 33/09     (2006.01)
  G01R 33/12     (2006.01)
  H01F 10/00     (2006.01)

(52) U.S. Cl.
  CPC ........... *G01R 33/00* (2013.01); *G01R 33/098* (2013.01); *G01R 33/1284* (2013.01); *G11B 5/64* (2013.01); *G11B 5/732* (2013.01); *G11B 5/851* (2013.01); *G11C 11/14* (2013.01); *G11C 11/161* (2013.01); *H01F 10/30* (2013.01); *H01F 10/3286* (2013.01); *H01L 43/08* (2013.01); *H01L 43/10* (2013.01); *H01L 43/12* (2013.01); *H01F 10/007* (2013.01)

(56) References Cited

U.S. PATENT DOCUMENTS

| | | | |
|---|---|---|---|
| 8,698,260 B2* | 4/2014 | Jan | H01L 43/08 257/421 |
| 9,082,960 B2* | 7/2015 | Jan | H01L 43/10 |
| 2011/0064969 A1* | 3/2011 | Chen | B82Y 25/00 428/800 |
| 2012/0012953 A1* | 1/2012 | Lottis | B82Y 25/00 257/421 |
| 2012/0018825 A1* | 1/2012 | Lim | H01L 43/08 257/421 |
| 2012/0020152 A1* | 1/2012 | Gaudin | G11C 11/16 365/171 |
| 2013/0052483 A1* | 2/2013 | Tahmasebi | G01R 33/093 428/811.2 |
| 2014/0077319 A1* | 3/2014 | Noma | H01L 43/02 257/421 |
| 2014/0131824 A1* | 5/2014 | Kitagawa | G11C 11/161 257/425 |

OTHER PUBLICATIONS

Thomas et al., Racetrack Memory: a high-performance, low-cost, non-volatile memory based on magnetic domain walls, IEDM11-535, pp. 24.2.1-24.2.4, 2011.

Miron et al., Current-driven spin torque induced by the Rashba effect in a ferromagnetic metal layer, Nature Materials, vol. 9, pp. 230-234, Mar. 2010.

Ikeda et al., A perpendicular-anisotropy CoFeB—MgO magnetic tunnel junction, Nature Materials, vol. 9, pp. 721-724, Sep. 2010.

Suzuki et al., Current-induced effective field in perpendicularly magnetized Ta/CoFeB/MgO wire, Applied Physics Letters 98, 142505 (2011).

Sinha et al., Enhanced perpendicular magnetic anisotropy in Ta/CoFeB/MgO by nitrogen doping the Ta underlayer, 12th Joint MMM-Intermag Conference, 2013.

International Search Report dated Jun. 25, 2013 for International application No. PCT/JP2013/058226.

International Preliminary Report on Patentability dated Sep. 23, 2014 for International application No. PCT/JP2013/058226.

* cited by examiner

PERPENDICULARLY MAGNETIZED ULTRATHIN FILM EXHIBITING HIGH PERPENDICULAR MAGNETIC ANISOTROPY, METHOD FOR MANUFACTURING SAME, AND APPLICATION

TECHNICAL FIELD

The present invention relates to an element structure of a magnetized ultrathin film exhibiting a high perpendicular magnetic anisotropy, which can be used in a magnetic recording medium and a magnetic memory, a method for manufacturing the same, and applications of the same.

BACKGROUND ART

Recently, magnetic materials that utilize the direction of magnetization as a memory bit of information have been increasingly expected to be applied to high-performance non-volatile memories. In particular, a technique for electrically controlling the magnetization in a magnetic body using a phenomenon called spin torque (spin injection magnetization reversal) is being developed (Non Patent Literature 1, 2). By using the spin torque, magnetization state of a giant magnetoresistance element, a tunneling magnetoresistance element, or a ferromagnetic thin wire can be controlled by electric current and/or field.

In addition, nowadays, a magnetization control mechanism by current-induced effective magnetic field using an ultrathin magnetic layer has been reported, and the establishment of a magnetization control method with further lower electric power is expected (Non Patent Literature 3). The current-induced effective magnetic field is thought to be due to a phenomenon that occurs by using different materials on both interfaces of a magnetic layer and reducing the thickness of the magnetic layer (Rashba effect or the like) or a spin hall effect in a non-magnetic layer adjacent to the magnetic layer.

A CoFeB perpendicularly magnetized film in which a CoFeB transition metal alloy is used as a magnetic layer, one layer in contact with the magnetic layer is an oxide layer made of MgO or the like, and the other layer in contact is a seed layer made of Ta or the like is a structure used in a tunneling magnetoresistance element (Non Patent Literature 4) and also is a system in which a current-induced effective magnetic field is generated (Non Patent Literature 5). It is known so far that magnetization of the magnetic layer can be controlled with low current using the current-induced effective magnetic field.

In order to effectively utilize spin injection magnetization reversal and the current-induced effective magnetic field, a thinner film thickness of the magnetic layer is better. According to an earlier study however, it is found that, when the film thickness of a magnetic layer made of CoFeB or the like is set at 1.5 nm or less, in particular 1 nm or less, the magnetization and the magnetic anisotropy decrease, and thus such a layer cannot be used as a magnetic layer.

CITATION LIST

Non Patent Literature

Non Patent Literature 1: S. Fukami et al., VLSI Tech. Symp., Dig. Tech. Papers, 230, (2009).
Non Patent Literature 2: L. Thomas et al., IEDM 11-535, (2011).
Non Patent Literature 3: I. M. Miron et al., Nat. Mater. 9, 230 (2010).
Non Patent Literature 4: S. Ikeda et al., Nat. Mater. 9, 721 (2010).
Non Patent Literature 5: T. Suzuki et al., Appl. Phys. Lett. 98, 142505 (2011).

SUMMARY OF INVENTION

Technical Problem

It is an object of the present invention to provide an element structure having a large magnetization and a perpendicular magnetic anisotropy with a magnetic layer having the film thickness of 1.5 nm or less, a method for manufacturing the same, and applications of the same.

Solution to Problem

The present inventors made extensive research so as to solve the above-described problem, and have found that the above-described problem can be solved by using, in a perpendicularly magnetized ultrathin film (a perpendicularly magnetized film in which the film thickness of the magnetic layer is 1.5 nm or less) having a seed layer/a magnetic layer/an oxide layer as the basic structure, at least one nitride of a BCC metal in the seed layer, CoFeB in the magnetic layer, and MgO in the oxide layer, and thereby arrived at the present invention.

Specifically, the present invention relates to any of the following [1] to [13].

[1] A perpendicularly magnetized ultrathin film exhibiting a perpendicular magnetic anisotropy having a configuration including a laminate film in which a seed layer, a magnetic layer, and an oxide layer are provided on a substrate, characterized in that the seed layer contains at least one nitride of a BCC metal, the magnetic layer contains CoFeB alloy, and the oxide layer contains MgO.

[2] The perpendicularly magnetized ultrathin film according to [1], wherein the nitride of a BCC metal is a nitride of Ta.

[3] The perpendicularly magnetized ultrathin film according to [2], wherein the component composition of the nitride of Ta is Ta:N=1:x (0<x<0.6).

[4] The perpendicularly magnetized ultrathin film according to [1], characterized in that the film thickness of the magnetic layer is 0.3 nm or more and 1.5 nm or less.

[5] The perpendicularly magnetized ultrathin film according to [1], characterized in that the component composition $(Co_xFe_{1-x})_yB_{1-y}$ of the CoFeB alloy has the relationships of $0<x\le 0.8$ and $y\ge 0.7$.

[6] The perpendicularly magnetized ultrathin film according to [1], characterized by having the magnetic properties that the perpendicular magnetic anisotropy is $0.1\times 10^6$ erg/cm$^3$ or more and the saturated magnetization is 200 emu/cm$^3$ or more.

[7] The perpendicularly magnetized ultrathin film according to claim 1, characterized by having the perpendicular magnetic anisotropy at an interface of the magnetic layer.

[8] A method for manufacturing the perpendicularly magnetized ultrathin film according to [1], characterized in that Q, the gas flow volume ratio of Ar and $N_2$ (defined as Q=$N_2$ flow/total flow of gas (Ar+$N_2$)), in the film formation of the seed layer by sputtering method has the relationship of $0<Q\le 0.05$.

[9] The method for manufacturing the perpendicularly magnetized ultrathin film according to [8], characterized in that heat treatment is performed in the temperature range of 150° C. or more and 350° C. or less after the film formation.

[10] A magnetic device comprising the perpendicularly magnetized ultrathin film according to any one of [1] to [7].

[11] The magnetic device according to [10], wherein the magnetic device is a magnetic recording memory.

[12] The magnetic device according to [10], wherein the magnetic device is a magnetic sensor.

[13] A perpendicularly magnetized ultrathin film exhibiting perpendicular magnetic anisotropy having a configuration including a laminate film in which a seed layer, a magnetic layer, and an oxide layer are provided on a substrate, characterized in that the seed layer contains at least one nitride of a BCC metal, and the magnetic layer contains an amorphous transition metal alloy containing B.

Advantageous Effects of Invention

According to the present invention, in a thin film in which a magnetic layer has a film thickness of 0.3 nm or more and 1.5 nm or less, an element structure having large magnetization and perpendicular magnetic anisotropy can be produced, and it can be used in a magnetic device such as a magnetic recording memory and a magnetic sensor.

DESCRIPTION OF EMBODIMENTS

Figure 1:
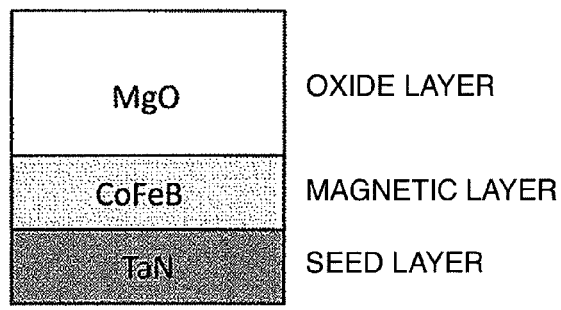
FIG. 1 is a schematic view of a thin film structure of a perpendicularly magnetized ultrathin film of the present invention.

In an embodiment of the present invention, in a thin film including a seed layer/a magnetic layer/an oxide layer shown in FIG. 1 as the basic structure, it is preferable that at least one nitride of a BCC metal be used in the seed layer, CoFeB be used in the magnetic layer, and MgO be used in the oxide layer. As the nitride of a BCC metal, a nitride of Ta, for example TaN, is preferable. It is preferable that the component composition of the nitride of Ta be Ta:N=1:x (0<x<0.6) in terms of the volume composition ratio. It is preferable that the nitrogen gas flow volume ratio in the film formation of the BCC metal nitride be limited to less than 5% and heat treatment at 150° C. or more and 350° C. or less be performed after the film formation. By virtue of this, a perpendicularly magnetized film having the magnetic properties that the perpendicular magnetic anisotropy is $0.1 \times 10^6$ erg/cm$^3$ or more and the saturated magnetization is 200 emu/cm$^3$ or more can be readily obtained even when the thickness of the magnetic layer is 0.3 nm or more and 1.5 nm or less.

In producing the above-described perpendicularly magnetized ultrathin film, conventional thin film forming techniques, such as sputtering method and vapor deposition method, can be used. Among these, sputtering method is most preferable. The perpendicularly magnetized ultrathin film comprises a multi-layer film in which the combination of seed layer/magnetic layer/oxide layer is provided on a substrate. Although there are various combinations as the combination of the substances to constitute the perpendicularly magnetized ultrathin film, a preferable combination among them is TaN/CoFeB/MgO.

At least one nitride of a BCC metal (for example, TaN, TiN, MN, CrN or the like) can be used in the seed layer, and TaN is more preferable. In order to obtain a large perpendicular magnetic anisotropy, the seed layer is preferably lattice matched with MgO, which is the oxide layer, and it is appropriate to use a BCC metal. An amorphous transition metal alloy containing B (for example, CoFeB, FeB, NiFeB or the like) can be used in the magnetic layer, and CoFeB is more preferable. MgO, $Al_2O_3$ and so on can be used in the oxide layer, and MgO is more preferable. As the substrate, a semiconductor, a glass substrate or the like is preferable, and a silicon substrate is more preferable.

Figure 3:
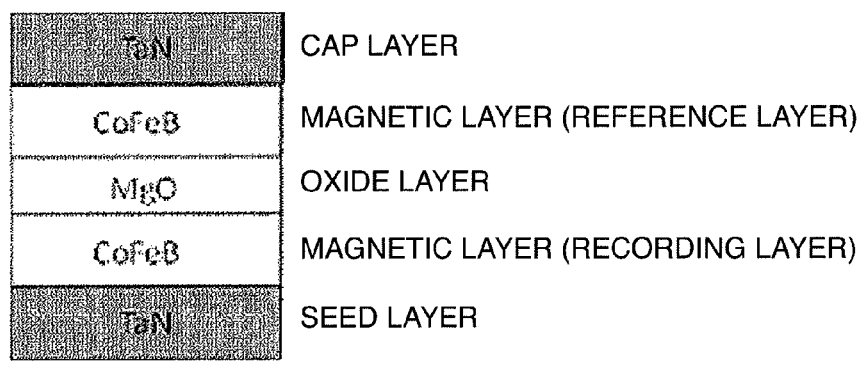
FIG. 3 is a schematic view of an example of a device structure using the perpendicularly magnetized ultrathin film of the present invention.

As the configuration of the multi-layer film, a configuration including a laminate film in which the seed layer/the magnetic layer/the oxide layer are provided in this order from the side of the substrate is preferable, but a similar effect can be obtained by a configuration including a laminate film in which the oxide layer/the magnetic layer/the seed layer are provided in this order from the side of the substrate as well. It is to be noted that, when producing a device using the above-described multi-layer film, a layer having a different function can be further provided as appropriate. For example, a magnetic layer that works as a reference layer of a tunneling magnetoresistance element may be provided on the oxide layer, and a cap layer may be further provided thereon. As the reference layer, a layer containing CoFeB is preferable, and as the cap layer, a layer made of TaN is preferable. An example of such a device structure is shown in FIG. 3.

The film thickness of the magnetic layer is preferably in the range of 1.5 nm or less and 0.3 nm or more. This is because the film thickness of 0.3 nm or more can effectively suppress a phenomenon in which magnetization of the magnetic layer becomes zero, and the film thickness of 1.5 nm or less can effectively achieve the perpendicular magnetic anisotropy. The film thickness of the seed layer is preferably 0.5 nm or more so as to form an uniform film and 20 nm or less so as not to cause an adverse effect on the flatness of a magnetic memory layer, and more preferably 10 nm or less. The film thickness of the oxide layer is preferably 0.5 nm or more so as to form an uniform film and 10 nm or less so as to reduce the damage to the magnetic layer in the sputtering.

In the case where the seed layer comprises TaN, the component composition of the TaN is preferably Ta:N=1:x (0<x<0.6). This is because the reduction in the magnetization of the magnetic layer can be prevented by setting x greater than 0, and a perpendicular magnetic anisotropy can be effectively achieved when x is less than 0.6.

The component composition of $(Co_xFe_{1-x})_yB_{1-y}$ alloy in the magnetic layer preferably has the relationships of $1>y\geq0.7$ and $0<x\leq0.8$. When the atomic ratio of B is 30% or less, reduction in the magnetization is inhibited, and when the ratio of Co/Fe is 4 or less, reduction in the perpendicular magnetic anisotropy is inhibited.

In the film formation of the seed layer, reactive sputtering in a gas atmosphere of Ar and $N_2$ can be used. In the reactive sputtering, Q, the gas flow volume ratio of Ar and $N_2$ (Q =$N_2$ flow/total flow of gas (Ar+$N_2$)), corresponds to the component composition ratio of the seed layer. It is to be noted that, as long as the component composition of the seed layer can be controlled, the production method is not necessarily limited to the reactive sputtering in a mixed gas atmosphere of argon and nitrogen, and, for example, a method in which a nitride target is sputtered or a method in which a BCC metal is sputtered and then is nitrided can also be used.

The produced multi-layer film is preferably subjected to a heat treatment, but the heat treatment does not need to be performed in the case where the magnetic layer exhibits a perpendicular magnetic anisotropy right after the production of the multi-layer film. The temperature range of the heat treatment is preferably from 100° C. to 500° C., and the holding time is usually preferably 30 minutes or more although it is not particularly limited as long as the MgO oxide layer is crystallized. MgO is crystallized by a heating at 100° C. or more, more preferably 150° C. or more, and atomic diffusion in the multi-layer film can be prevented in the case of heating at 500° C. or less, more preferably 350° C.

It is to be noted that each of the following (1) to (7) is a preferred embodiments of the present invention.

(1) A perpendicularly magnetized ultrathin film exhibiting a perpendicular magnetic anisotropy comprising a seed layer, a magnetic layer, and an oxide layer on a substrate, characterized in that the seed layer is TaN, the magnetic layer is a CoFeB alloy, and the oxide layer is MgO.

(2) The perpendicularly magnetized ultrathin film according to the above-described (1), characterized in that the film thickness of the magnetic layer is 0.3 nm or more and 1.5 nm or less.

(3) The perpendicularly magnetized ultrathin film according to the above-described (1), characterized in that the component composition $(Co_xFe_{1-x})_yB_{1-y}$ of the CoFeB alloy of the magnetic layer has the relationships of $0<x\leq 0.8$ and $y\geq 0.7$.

(4) The perpendicularly magnetized ultrathin film according to the above-described (1), characterized by having the magnetic properties that the perpendicular magnetic anisotropy is $0.1\times 10^6$ erg/cm$^3$ or more and saturated magnetization is 200 emu/cm$^3$ or more.

(5) A method for manufacturing the perpendicularly magnetized ultrathin film exhibiting a perpendicular magnetic anisotropy comprising a seed layer, a magnetic layer, and an oxide layer on a substrate according to the above-described (1), characterized in that the gas flow ratio of $N_2$ to Ar (defined as Q) in film formation of the TaN seed layer by a sputtering method has the relationship of $0<Q\leq 0.2$.

(6) The method for manufacturing the perpendicularly magnetized ultrathin film according to the above-described (5), characterized in that heat treatment is performed in the temperature range of 150° C. or more and 350° C. or less after the film formation.

(7) An in-plane current applying type magnetic recording memory or magnetic device characterized by comprising the perpendicularly magnetized ultrathin film according to any one of the above-described (1) to (4).

EXAMPLES

Hereinafter, the present invention will be described in more detail with reference to Examples. It is to be noted that the present invention is not limited to the following Examples in any sense.

Example 1

A thin film was produced on a silicon substrate using magnetron sputtering method. As the silicon substrate, one with a thermally-oxidized film having the thickness of 100 nm was used. The sputtering was performed in an ultrahigh vacuum chamber with the pressure of $5\times 10^{-7}$ Pa or less. In the film formation of Ta or TaN, and CoFeB, DC sputtering (10 W) was used, and in the film formation of MgO, RF sputtering (100 W) was used. The Ar gas pressure was 1.1 Pa in the film formation of Ta, 0.4 Pa in the film formation of CoFeB, and 1.3 Pa in the film formation of MgO. The total gas pressure was fixed at 1.1 Pa in the film formation of TaN, and, by adjusting Q, the gas flow volume ratio of Ar and $N_2$ (Q=$N_2$ flow/total flow of gas (Ar+$N_2$)), TaN (Ta when Q=0) film was formed. The composition of the target was applied to the composition of the CoFeB formed as the film. After the film-forming of the seed layer/the magnetic layer/the oxide layer, a Ta layer having the thickness of 1 nm was film-formed as a protection layer to protect the oxide layer from water and the like.

Heat treatment was performed in a vacuum chamber ($1\times 10^{-4}$ Pa or less). The heat treatment was performed at a predetermined temperature for 1 hour.

The magnetization curve was measured using a vibrating sample magnetometer (VSM). Magnetization components in the perpendicular direction (perpendicular magnetization curve) and in the horizontal direction (in-plane magnetization curve) to the film surface were measured. The magnetic anisotropy constant was determined from the area surrounded by the perpendicular magnetization curve and the in-plane magnetization curve (see FIG. 2). The positive value represents a perpendicular magnetic anisotropy and the negative value represents an in-plane magnetic anisotropy.

Figure 2:
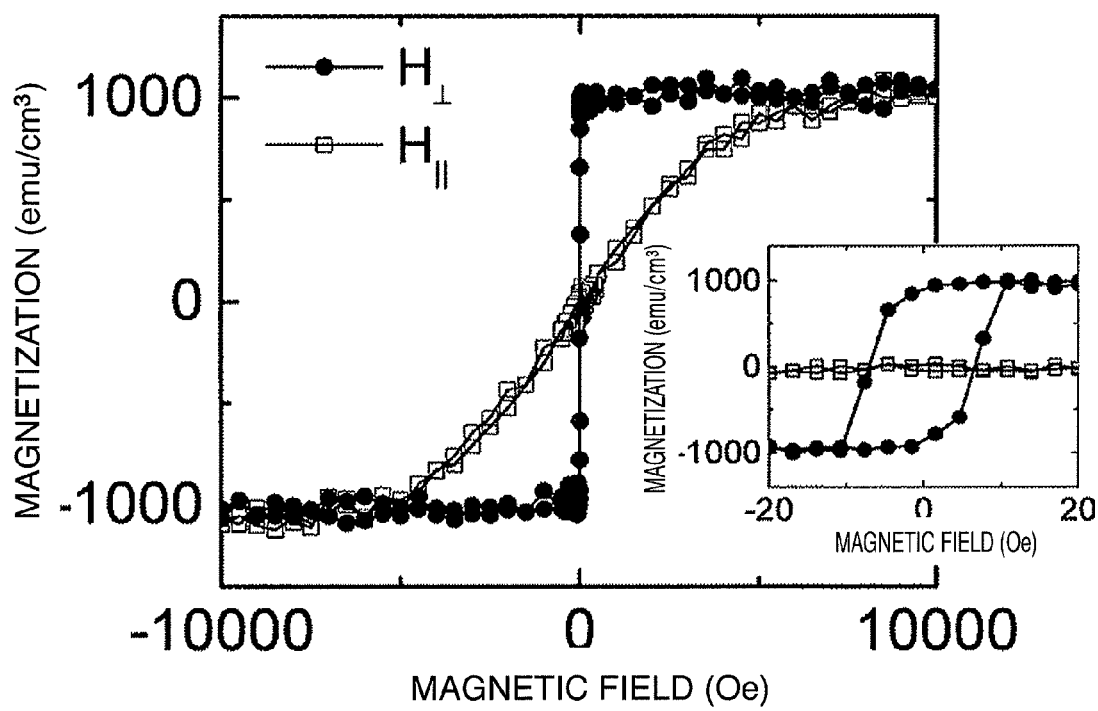
FIG. 2 is a magnetization curve of a perpendicularly magnetized ultrathin film of an example of the present invention.

In FIG. 2, in order to expressly indicate that $H_\perp$ has hysteresis, a drawing enlarged along the horizontal axis is also shown. It is to be noted that the present Example has a large film area for confirming the principle, and when a perpendicularly magnetized ultrathin film of the present invention is actually used as a device, the opening and the squareness of the hysteresis loop would be clearer as the element is miniaturized.

The magnetization curve of the TaN/CoFeB/MgO/Ta multi-layer film is shown in FIG. 2. Regarding the film thickness of each layer, TaN is 4 nm, CoFeB is 0.6 nm, MgO is 2 nm, and Ta is 1 nm. Here, the Ta layer was provided as a protection layer. The composition of CoFeB is $(Co_{0.25}Fe_{0.75})_{0.8}B_{0.2}$. The nitrogen gas flow volume ratio Q in the sputtering chamber in the film formation of TaN was 0.013. After the film formation, the heat treatment was performed in a vacuum chamber at 300° C. for 1 hour.

From the magnetization curve shown in FIG. 2, it can be seen that a perpendicular magnetic anisotropy is exhibited even when the film thickness of the CoFeB magnetic layer is 0.6 nm. The saturated magnetization that represents the magnitude of magnetization is 1030 emu/cm$^3$, and the magnetic anisotropy constant is $2.76\times 10^6$ erg/cm$^3$.

Table 1 shows the dependencies of the magnetic anisotropy constant and the saturated magnetization of the CoFeB layer on the nitrogen gas flow ratio in film formation of the seed layer. The film configuration is TaN/CoFeB/MgO/Ta, and regarding the film thickness of each layer, TaN is 1 nm, MgO is 2 nm, and Ta is 1 nm. Regarding the film thickness of CoFeB, two cases, 0.6 nm and 1.2 nm namely, were compared, and the composition was $(Co_{0.25}Fe_{0.75})_{0.8}B_{0.2}$. After the film formation, heat treatment was performed at 300° C. for 1 hour. Five cases in which Q, the flow volume ratio of $N_2$ gas and Ar gas in the sputtering chamber in the film formation of TaN, are different are compared.

TABLE 1

| | CoFeB Film Thickness (nm) | | | | | |
|---|---|---|---|---|---|---|
| | 1 | | | 0.6 | | |
| Nitrogen Gas Flow Ratio, Q | Magnetic Anisotropy Constant (erg/cm$^3$) ×10$^6$ | Saturated Magnetization (emu/cm$^3$) | Judgement | Magnetic Anisotropy Constant (erg/cm$^3$) ×10$^6$ | Saturated Magnetization (emu/cm$^3$) | Judgement |
| 0 (Comparison) | 1.70 | 706.20 | | −0.20 | 128.7 | |
| 0.013 | 2.70 | 1218.50 | ○ | 1.23 | 1036.7 | ○ |
| 0.025 | 2.00 | 1283.10 | ○ | 0.31 | 1215.6 | ○ |
| 0.05 | −0.80 | 1434.80 | x | −1.29 | 1030.1 | x |
| 0.1 | −0.90 | 1484.50 | x | −0.79 | 1326.5 | x |

Judgement Criteria: Magnetic Anisotropy Constant of 0.1 × 10$^6$ erg/cm$^3$ or more and Saturated Magnetization of 200 emu/cm$^3$ or more
Film Configuration: 1 nm Seed Layer/CoFeB/2 nm MgO/1 nm Ta
Heat Treatment Temperature: 300° C.

According to the results in Table 1, it is revealed that, when nitrogen is introduced into the gas atmosphere in the film formation of the seed layer, the magnetic anisotropy constant has a positive value (a perpendicular magnetic anisotropy is achieved) even in the case where the film thickness of CoFeB is thin (0.6 nm). Moreover, in comparison with the case where nitrogen is not introduced into the gas atmosphere (Comparative Example), the saturated magnetization exhibits a value closer to that of bulk (reference: $(Co_{25}Fe_{75})_{80}B_{20}$: 1490 emu/cm$^3$, $Co_{25}Fe_{75}$: 1870 emu/cm$^3$). On the other hand, when the nitrogen gas flow volume ratio Q is more than 0.05, the magnetic anisotropy of the CoFeB layer is negative.

Although the amount of nitrogen in TaN is proportional to the gas flow volume ratio, the amount of nitrogen in TaN may change depending on the configuration and the specification of the apparatus even when the gas flow is constant, and thus the gas flow volume ratio Q required for producing the structure having the magnetic properties that the perpendicular magnetic anisotropy constant is 0.1×10$^6$ erg/cm$^3$ or more and the saturated magnetization is 200 emu/cm$^3$ or more is desirably 0<Q<0.05. Moreover, the nitrogen gas flow volume ratio Q and the film thickness of the magnetic layer that satisfy the judgement criteria change depending on the heat treatment temperature. For example, in the case where the heat treatment temperature is 300° C. and Q is 0.025, the judgement criteria may not be satisfied when the film thickness of the magnetic layer is 1.2 nm, whereas the criteria are satisfied when the heat treatment temperature is increased.

According to the transmission electron microscopic analysis, it is revealed that TaN in the seed layer has an amorphous structure when the nitrogen gas flow volume ratio Q is 0.013, at which the magnetic anisotropy exhibits the maximum. Similarly, in the case where the seed layer is Ta, an amorphous structure was observed.

Composition analysis was performed using the Rutherford Backscattering Spectroscopy Method, and it was revealed that the volume composition of the TaN seed layer was Ta:N=1:0.6 when the nitrogen gas flow ratio was Q=0.05, and Ta:N=1:0.55 when Q=0.025. Accordingly, the volume composition ratio of the TaN seed layer (Ta:N=1:x) is desirably within a range of 0<x<0.6 so as to obtain a large perpendicular magnetic anisotropy.

Table 2 shows heat treatment temperature dependencies of the magnetic anisotropy constant and the saturated magnetization of the CoFeB layer. The film configuration is seed layer/CoFeB/MgO/Ta. The heat treatment was performed for 1 hour at each prescribed temperature after the film formation. Regarding the film thickness of each layer, the seed layer is 1 nm, CoFeB is 0.6 nm, MgO is 2 nm, and Ta is 1 nm. The composition of CoFeB is $(Co_{0.25}Fe_{0.75})_{0.8}B_{0.2}$. Regarding the nitrogen gas flow volume ratio Q in the sputtering chamber in the film formation of TaN, two cases, 0.013 and 0.025 namely, are shown. In addition, as a Comparative Example, the case where the seed layer is Ta is also shown.

TABLE 2

| | Nitrogen Gas Flow Ratio, Q | | | | | | | |
|---|---|---|---|---|---|---|---|---|
| | 0 (Comparison) | | 0.013 | | | 0.025 | | |
| Heat Treatment Temperature (° C.) | Magnetic Anisotropy Constant (erg/cm$^3$) ×10$^6$ | Saturated Magnetization (emu/cm$^3$) | Magnetic Anisotropy Constant (erg/cm$^3$) ×10$^6$ | Saturated Magnetization (emu/cm$^3$) | Judgement | Magnetic Anisotropy Constant (erg/cm$^3$) ×10$^6$ | Saturated Magnetization (emu/cm$^3$) | Judgement |
| None | 0.03 | 568.1 | −0.89 | 790.5 | x | −0.9 | 843.4 | x |
| 200 | 1.35 | 472.6 | 0.68 | 751.5 | ○ | 0.4 | 1039.1 | ○ |
| 250 | 0.63 | 275.5 | 1.54 | 948.2 | ○ | 1.0 | 1092.1 | ○ |
| 275 | 0.27 | 204.4 | 1.66 | 886.0 | ○ | 0.5 | 1177.0 | ○ |
| 300 | −0.20 | 128.7 | 1.23 | 1036.7 | ○ | 0.3 | 1215.6 | ○ |

Judgement Criteria: Magnetic Anisotropy Constant of 0.1 × 10$^6$ erg/cm$^3$ or more and Saturated Magnetization of 200 emu/cm$^3$ or more
Film Configuration: 1 nm Seed Layer/0.6 nm CoFeB/2 nm MgO/1 nm Ta According to the results in Table 2, it can be seen that the thermal stability is improved by virtue of using TaN in a underlayer to CoFeB in comparison with the case where Ta is used. In the case where TaN having the nitrogen gas flow volume ratio Q in the film formation of 0.013 was used in the seed layer, the magnetic anisotropy constant exhibited the largest value ($1.66\times10^6$ erg/cm$^3$) at the heat treatment temperature of 275° C., and the saturated magnetization was increased in comparison with that before the heat treatment.

the seed layer are also shown. Similarly, the heat treatment is performed at 300° C. for 1 hour, the composition of CoFeB is also $(Co_{0.25}Fe_{0.75})_{0.8}B_{0.2}$, and regarding the film thickness of each layer, the Ta seed layer is 1 nm, MgO is 2 nm, and Ta (cap layer) is 1 nm.

The negative anisotropy constant in the case where no heat treatment was carried out is attributed to the absence of the crystallization of the MgO oxide layer.

TABLE 3

| | Nitrogen Gas Flow Ratio, Q | | | | | | | |
|---|---|---|---|---|---|---|---|---|
| | 0 (Comparison) | | 0.007 | | | 0.013 | | |
| CoFeB Film Thickness (nm) | Magnetic Anisotropy Constant (erg/cm$^3$) $\times10^6$ | Saturated Magnetization (emu/cm$^3$) | Magnetic Anisotropy Constant (erg/cm$^3$) $\times10^6$ | Saturated Magnetization (emu/cm$^3$) | Judgement | Magnetic Anisotropy Constant (erg/cm$^3$) $\times10^6$ | Saturated Magnetization (emu/cm$^3$) | Judgement |
| 2 | −2.98 | 1429.4 | −3.2 | 1438.9 | x | −2.79 | 1046.2 | x |
| 1.8 | | | −1.6 | 1373.6 | x | −2.07 | 1234.1 | x |
| 1.6 | 0.27 | 1299.7 | −0.4 | 1381.4 | x | −1.65 | 1433.7 | x |
| 1.4 | 0.64 | 1162.3 | 1.3 | 1345.4 | o | | | |
| 1.2 | 1.67 | 974.1 | 2.9 | 1276.7 | o | 1.48 | 1098.0 | o |
| 1 | 1.70 | 706.2 | 3.4 | 1249.9 | o | 2.71 | 1218.5 | o |
| 0.9 | | | 3.7 | 1203.4 | o | 3.11 | 1115.2 | o |
| 0.8 | 1.05 | 604.7 | 3.8 | 1169.4 | o | 3.31 | 1017.8 | o |
| 0.7 | | | 3.9 | 1158.5 | o | 3.40 | 893.7 | o |
| 0.6 | −0.20 | 128.7 | 3.0 | 1019.8 | o | 2.76 | 1028.9 | o |
| 0.5 | | | 1.9 | 789.9 | o | 0.20 | 732.1 | o |
| 0.4 | | | 0.7 | 453.2 | o | 0.15 | 387.9 | o |

| | Nitrogen Gas Flow Ratio, Q | | | | | |
|---|---|---|---|---|---|---|
| | 0.025 | | | 0.1 | | |
| CoFeB Film Thickness (nm) | Magnetic Anisotropy Constant (erg/cm$^3$) $\times10^6$ | Saturated Magnetization (emu/cm$^3$) | Judgement | Magnetic Anisotropy Constant (erg/cm$^3$) $\times10^6$ | Saturated Magnetization (emu/cm$^3$) | Judgement |
| 2 | −4.2 | 1423.4 | x | −5.4 | 1495.8 | x |
| 1.8 | −3.5 | 1382.6 | x | −4.2 | 1443.6 | x |
| 1.6 | −2.6 | 1366.9 | x | −3.9 | 1429.9 | x |
| 1.4 | | | | −2.7 | 1465.0 | x |
| 1.2 | | | | −2.4 | 1528.3 | x |
| 1 | 2.0 | 1283.1 | o | −0.9 | 1484.5 | x |
| 0.9 | | | | | | |
| 0.8 | 2.6 | 1390.0 | o | 0.0 | 1484.6 | x |
| 0.7 | 2.0 | 1113.8 | o | | | |
| 0.6 | 1.6 | 1215.7 | o | −0.3 | 1187.6 | x |
| 0.5 | 0.6 | 1175.8 | o | −0.4 | 620.6 | x |
| 0.4 | | | | | | |

Judgement Criteria: Magnetic Anisotropy Constant of $0.1 \times 10^6$ erg/cm$^3$ or more and Saturated Magnetization of 200 emu/cm$^3$ or more
Film Configuration: 4 nm Seed Layer/CoFeB/2 nm MgO/1 nm Ta
Heat Treatment Temperature: 300° C.

Table 3 shows CoFeB layer film thickness dependencies of the magnetic anisotropy constant and the saturated magnetization of the CoFeB layer. The film configuration was TaN/CoFeB/MgO/Ta, and after the film formation, heat treatment was performed at 300° C. for 1 hour. The composition of CoFeB is $(Co_{0.25}Fe_{0.75})_{0.8}B_{0.2}$. Regarding the film thickness of each layer, TaN is 4 nm, MgO is 2 nm, and Ta is 1 nm. Regarding the nitrogen gas flow volume ratio Q in the sputtering chamber in the film formation of TaN, four cases, 0.007, 0.013, 0.025, and 0.10 namely, are shown. The total gas pressure was 1.1 Pa. In addition, as a Comparative Example, results of CoFeB layer film thickness dependencies of the saturated magnetization and the magnetic anisotropy constant of Ta/CoFeB/MgO/Ta in which Ta was used in According to the results in Table 3, it can be seen that an element structure exhibiting a positive magnetic anisotropy constant of $0.1\times10^6$ emu/cm$^3$ or more and a saturated magnetization of more than 200 emu/cm$^3$ can be produced even in a region where the film thickness of the CoFeB layer is small by virtue of using TaN in the seed layer in contrast to the case of using Ta. The smaller the nitrogen gas flow volume ratio Q in the film formation is, the larger the magnetic anisotropy constant obtained is. The nitrogen gas flow volume ratio Q and the film thickness of the magnetic layer that satisfy the judgement criteria change depending on the heat treatment temperature. For example, in the case where the heat treatment temperature is 300° C. and Q is 0.025, the judgement criteria may not be satisfied when the film thickness of the magnetic layer is 0.5 nm or 1.2 to 1.5 nm, but the criteria are satisfied when the heat treatment temperature is increased.

TABLE 4

| Nitrogen Gas Flow Ratio, Q | Interface Magnetic Anisotropy (erg/cm$^2$) |
|---|---|
| 0 (Comparison) | 1.46 |
| 0.007 | 1.80 |
| 0.025 | 1.15 |
| 0.05 | 0.80 |
| 0.1 | 0.70 |

Film Configuration: Seed Layer/CoFeB/2 nm MgO/1 nm Ta
Heat Treatment Temperature: 300° C.

Table 4 shows interface magnetic anisotropy in the laminate structure of the seed layer/CoFeB/MgO/Ta when the nitrogen gas flow volume ratio Q in the film formation of the seed layer was changed. The film thickness of the TaN seed layer (Q>0) is 4 nm, and the film thickness of the Ta seed layer (Q: 0) shown as a Comparative Example is 1 nm. After the film formation, the heat treatment was performed at 300° C. for 1 hour. The composition of CoFeB is $(Co_{0.25}Fe_{0.75})_{0.8}B_{0.2}$.

According to the results of Table 4, it can be seen that the interface magnetic anisotropy exhibits the maximum value when the nitrogen gas flow volume ratio Q in the film formation of the seed layer is 0.007. It is suggested that the interface perpendicular magnetic anisotropy of the CoFeB layer increases by virtue of using TaN (Q=0.007) in the seed layer. The fact that a large perpendicular magnetic anisotropy is exhibited even when the film thickness of the magnetic layer is 1.5 nm or less (0.3 nm or more) in the case where TaN is used for the seed layer is attributed to the increase in the perpendicular magnetic anisotropy at the interface of the magnetic layer.

INDUSTRIAL APPLICABILITY

The present invention is expected to be used in magnetic devices, such as a magnetic sensor and a magnetic recording memory, produced by using a perpendicularly magnetized ultrathin film, and thus has a high industrial applicability.

The invention claimed is:

1. A perpendicularly magnetized ultrathin film exhibiting a perpendicular magnetic anisotropy comprising
    a seed layer,
    a magnetic layer, and
    an oxide layer on a substrate, characterized in that
    the seed layer is TaN,
    the magnetic layer contains CoFeB alloy,
    the oxide layer contains MgO,
    the film thickness of the magnetic layer is 0.3 nm or more and 1.5 nm or less,
    the perpendicularly magnetized ultrathin film has the magnetic properties that the perpendicular magnetic anisotropy is $0.1 \times 10^6$ erg/cm$^3$ or more and the saturated magnetization is 200 emu/cm$^3$ or more, and
    the seed layer and the oxide layer are in direct contact with the magnetic layer.

2. The perpendicularly magnetized ultrathin film according to claim 1, characterized in that the component composition $(Co_xFe_{1-x})_yB_{1-y}$ of the CoFeB alloy of the magnetic layer has the relationships of 0 <x≤0.8 and y≥0.7.

3. A method for manufacturing the perpendicularly magnetized ultrathin film according to claim 1, characterized in that Q, the gas flow volume ratio of Ar and N$_2$ (defined as Q=N$_2$ flow/total flow of gas (Ar +N$_2$), in the film formation of the seed layer by sputtering method has the relationship of 0<Q<0.05.

4. The method for manufacturing the perpendicularly magnetized ultrathin film according to claim 3, characterized in that heat treatment is performed in the temperature range of 150° C. or more and 350° C. or less after the film formation.

5. An in-plane current applying type magnetic recording memory or magnetic device, characterized by comprising the perpendicularly magnetized ultrathin film according to claim 1.

6. An in-plane current applying type magnetic recording memory or magnetic device, characterized by comprising the perpendicularly magnetized ultrathin film according to claim 1.

* * * * *